(12) United States Patent
Lin et al.

(10) Patent No.: US 11,854,949 B2
(45) Date of Patent: Dec. 26, 2023

(54) PACKAGE STRUCTURE HAVING A PLURALITY OF CHIPS ATTACHED TO A LEAD FRAME BY REDISTRIBUTION LAYER

(71) Applicant: JCET GROUP CO., LTD., Wuxi (CN)

(72) Inventors: Yaojian Lin, Wuxi (CN); Danfeng Yang, Wuxi (CN); Shuo Liu, Wuxi (CN); Chenye He, Wuxi (CN)

(73) Assignee: JCET GROUP CO., LTD., Wuxi (CN)

( * ) Notice: Subject to any disclaimer, the term of this patent is extended or adjusted under 35 U.S.C. 154(b) by 99 days.

(21) Appl. No.: 17/531,736

(22) Filed: Nov. 20, 2021

(65) Prior Publication Data

US 2022/0399254 A1     Dec. 15, 2022

(30) Foreign Application Priority Data

Jun. 11, 2021   (CN) .................... 202110655877.4

(51) Int. Cl.
    *H01L 23/495*  (2006.01)
    *H01L 21/48*   (2006.01)
    *H01L 21/56*   (2006.01)
    *H01L 21/78*   (2006.01)
    *H01L 23/31*   (2006.01)
    (Continued)

(52) U.S. Cl.
    CPC .... *H01L 23/49534* (2013.01); *H01L 21/4857* (2013.01); *H01L 21/56* (2013.01); *H01L 21/78* (2013.01); *H01L 23/3107* (2013.01); *H01L 23/3135* (2013.01); *H01L 23/34* (2013.01); *H01L 23/4952* (2013.01); *H01L 24/24* (2013.01); *H01L 24/29* (2013.01); *H01L 24/32* (2013.01); *H01L 24/83* (2013.01); *H01L 24/97* (2013.01); *H01L 2224/97* (2013.01); *H01L 2924/181* (2013.01)

(58) Field of Classification Search
    CPC .......... H01L 2924/181; H01L 2224/97; H01L 21/4857; H01L 21/56; H01L 21/78; H01L 23/49534; H01L 23/3135; H01L 23/34; H01L 23/4952; H01L 23/3107; H01L 24/97; H01L 24/83; H01L 24/32; H01L 24/29; H01L 24/24
    See application file for complete search history.

(56) References Cited

U.S. PATENT DOCUMENTS

| | | | |
|---|---|---|---|
| 6,333,564 B1* | 12/2001 | Katoh | H01L 25/0657 257/E23.092 |
| 2008/0032447 A1* | 2/2008 | Lee | H01L 21/56 438/106 |
| 2015/0194362 A1* | 7/2015 | Otremba | H01L 24/18 257/676 |

* cited by examiner

*Primary Examiner* — Alonzo Chambliss
(74) *Attorney, Agent, or Firm* — Cheng-Ju Chiang

(57) ABSTRACT

The present invention provides a package structure and a method for manufacturing the same. The package structure includes at least two electrical elements, a second reconstruction layer, and a metal lead frame, wherein at least one of the electrical elements is a chip, at least one of the electrical elements has a first reconstruction layer, and the second reconstruction layer has a smaller pin pitch than that of the metal lead frame; the second reconstruction layer has a first surface and a second surface, a functional surface of the electrical element is disposed on and connected to the first surface, and at least one of the electrical elements is connected to the second reconstruction layer; and the second surface is disposed on and connected to the metal lead frame. A fan-out package structure is formed on the metal lead frame, which improves the heat dissipation capacity of the chip.

20 Claims, 6 Drawing Sheets

(51) Int. Cl.
*H01L 23/34* (2006.01)
*H01L 23/00* (2006.01)

PACKAGE STRUCTURE HAVING A PLURALITY OF CHIPS ATTACHED TO A LEAD FRAME BY REDISTRIBUTION LAYER

TECHNICAL FIELD

The present invention relates to the field of package technologies, and in particular, relates to a package structure and a method for manufacturing the same.

BACKGROUND

As electronic products are continuously developing towards miniaturization, multi-function, and high integration, the requirements for the cost, heat dissipation, reliability and the like of chip package structures are getting higher and higher. A fan-out package is available for the formation of multiple layers of high-density wiring, but is lower in reliability and poorer in heat dissipation capacity. As the package structure becomes more highly integrated, its problem of heat dissipation becomes more prominent. Lead-frame type packages (such as QFN and QFP, etc.) for chips have the characteristics of low cost, ease of thermal management and high reliability, but can hardly support higher-density wiring, in particular multi-layer wiring. Therefore, how to combine the fan-out package with the lead-frame package has become the key to solving the problem.

SUMMARY

An object of the present invention is to provide a package structure and a method for manufacturing the same.

The present invention provides a package structure. The package structure includes at least two electrical elements, a second reconstruction layer, and a metal lead frame, wherein at least one of the electrical elements is a chip, at least one of the electrical elements has a first reconstruction layer, and the second reconstruction layer has a smaller pin pitch than that of the metal lead frame;

the second reconstruction layer has a first surface 41 and a second surface 42 which are opposite to each other, a functional surface of the electrical element is disposed on and electrically connected to the first surface of the second reconstruction layer, and the electrical element is electrically connected to the second reconstruction layer through the first reconstruction layer disposed on the functional surface thereof; and the second surface of the second reconstruction layer is disposed on and electrically connected to the metal lead frame.

As a further improvement of the present invention, the first reconstruction layer is a first redistribution layer or a first interposer, and the second reconstruction layer is a second redistribution layer.

As a further improvement of the present invention, a metal wiring region within the second redistribution layer at least exceeds an outer edge of one side of each of the electrical elements.

As a further improvement of the present invention, the second redistribution layer is disposed on the metal lead frame through a metal bump. A distance between an outer surface of the metal lead frame and the functional surface of the chip is at least greater than 50 μm.

As a further improvement of the present invention, the package structure further includes: a first plastic package layer and a second plastic package layer, wherein the first plastic package layer covers the electrical elements and the first reconstruction layer; the second plastic package layer covers the first plastic package layer, the second reconstruction layer, and the metal lead frame; and the first plastic package layer and the second plastic package layer each include a first surface on a non-functional surface side of each of the electrical elements and a second surface opposite to the first surface.

As a further improvement of the present invention, the second surface of the first plastic package layer exposes the first reconstruction layer, and the second reconstruction layer is disposed on the first redistribution layer and the second surface of the first plastic package layer.

As a further improvement of the present invention, the first plastic package layer and the first surface of the second plastic package layer expose the non-functional surface of the chip.

As a further improvement of the present invention, a heat dissipation layer or a heat dissipation structural member is disposed on the first plastic package layer, the first surface of the second plastic package layer, and the non-functional surface of the chip.

As a further improvement of the present invention, a heat dissipation layer or a heat dissipation structural member is disposed on the non-functional surface of the chip; the first plastic package layer covers the heat dissipation layer or the heat dissipation structural member; and the first plastic package layer and the second plastic package layer expose a surface region of the heat dissipation layer or of the heat dissipation structural member.

As a further improvement of the present invention, the first plastic package layer exposes the non-functional surface of the chip; a heat sink is disposed on the non-functional surface of the chip and is connected to the metal lead frame; and the second plastic package layer covers the heat sink and exposes a surface region of the heat sink.

As a further improvement of the present invention, a heat dissipation layer or a heat dissipation structural member is disposed between the non-functional surface of the chip and the heat sink.

As a further improvement of the present invention, the metal lead frame is provided with a chip-on-frame and/or a device-on-frame.

The present invention further provides a method for manufacturing a package structure.

The method includes the following steps:

providing at least two electrical elements, at least one of which is a chip, and forming a first reconstruction layer at least on a functional surface of one of the electrical elements;

forming a first plastic package layer by performing plastic packaging on the set of electrical elements;

forming a second reconstruction layer on the first reconstruction layer, the first plastic package layer, and portions of the electrical elements where the first reconstruction layer is not disposed;

cutting a resultant to obtain a singulated package, flip-mounting the package on a metal lead frame, and electrically connecting the second reconstruction layer to the metal lead frame; and forming a second plastic package layer by performing plastic packaging on the package and the metal lead frame.

As a further improvement of the present invention, the first reconstruction layer is a first redistribution layer or a first interposer, and the second reconstruction layer is a second redistribution layer.

As a further improvement of the present invention, metal wiring within the second redistribution layer at least exceeds an outer edge of one side of each of the electrical elements.

As a further improvement of the present invention, the method further includes the following steps:

arranging a metal bump on the second reconstruction layer, flip-mounting the second reconstruction layer on the metal lead frame through the metal bump, and controlling a distance between the metal lead frame and the functional surface of the chip to be at least greater than 50 μm.

As a further improvement of the present invention, the method further includes the following steps:

exposing a non-functional surface of the chip by thinning the first plastic package layer and the second plastic package layer, and forming a heat dissipation layer or arranging a heat dissipation structural member on the non-functional surface of the chip.

As a further improvement of the present invention, the method further includes the following steps:

forming a heat dissipation layer or arranging a heat dissipation structural member on a non-functional surface of the chip before forming the first plastic package layer; and exposing a surface region of the heat dissipation layer or of the heat dissipation structural member by thinning the first plastic package layer and the second plastic package layer.

As a further improvement of the present invention, the method further includes the following steps:

exposing a non-functional surface of the chip by thinning the first plastic package layer;

arranging a heat sink on the non-functional surface of the chip before forming the second plastic package layer, and connecting the heat sink to the metal lead frame; and exposing a surface region of the heat sink by thinning the second plastic package layer.

As a further improvement of the present invention, the method further includes the following step:

arranging a chip-on-frame and/or a device-on-frame on the metal lead frame.

The present invention has the following beneficial effects. According to the present invention, by forming an electrical interconnection between the chipset having high-density I/O ports and the metal lead frame sequentially through the first redistribution layer or the first interposer and the second redistribution layer, a fan-out package structure with high-density wiring is formed on the metal lead frame having the advantages such as low cost, high reliability and ease of thermal management; and the heat dissipation capacity of the functional surface of the chip is greatly improved by the metal lead frame. Thus, the package structure achieves excellent heat dissipation performance and reliability while being provided with the high-density wiring.

DETAILED DESCRIPTION

Figure 1:
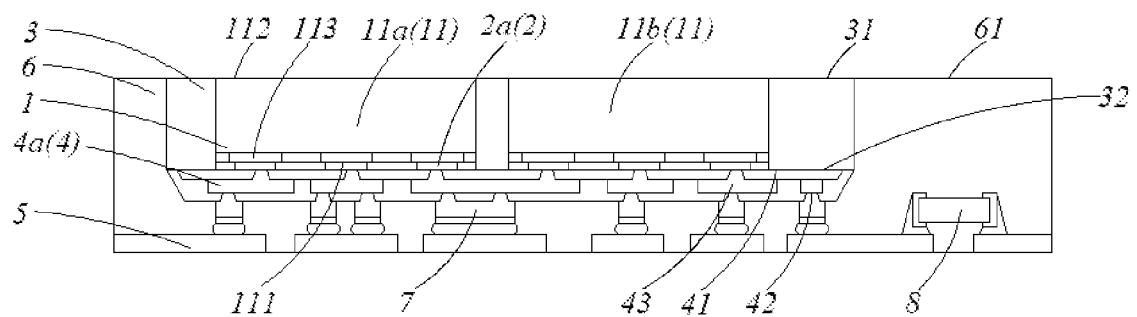
FIG. 1 is a schematic diagram of a package structure according to Embodiment 1 of the present invention.

In order to make the purpose, technical solutions, and advantages of the present application clearer, the technical solutions of the present application will be clearly and completely described below in conjunction with the specific embodiments of the present application and the corresponding drawings. Obviously, the described embodiments are only a part of the embodiments of the present application, rather than all of the embodiments. Based on the embodiments in this application, all other embodiments obtained by those of ordinary skill in the art without creative work shall fall within the protection scope of this application.

The following describes the embodiments of the present invention in detail. Examples of the embodiments are shown in the accompanying drawings, in which the same or similar reference numerals indicate the same or similar elements or elements with the same or similar functions through the whole text. The following embodiments described with reference to the accompanying drawings are exemplary, and are only used to explain the present invention, but should not be understood as limiting the same.

For the convenience of description, this application uses terms representing the relative positions in space for description, such as "upper", "lower", "rear", "front", etc., which are used to describe the relationship of one unit or feature shown in the drawings relative to another unit or feature. The terms describing the relative positions in space may include different orientations of the equipment in use or operation other than the orientations shown in the drawings. For example, if a device in the drawings is turned over, the unit described as being "below" or "above" other units or features will be positioned "above" or "below" the other units or features. Therefore, the exemplary term "below" can encompass both spatial orientations of below and above.

As shown in FIG. 1 to FIG. 4, the present invention provides a package structure. The package structure includes at least two electrical elements 1, a first reconstruction layer 2, a first plastic package layer 3, a second reconstruction layer 4, a metal lead frame 5, and a second plastic package layer 6.

The electrical elements 1 include at least one chip 11, and may further include a second package structure, or a passive element. The passive element is a common circuit component such as a capacitor and a resistor. The second package structure is a package structure with a relatively small size, and internally includes devices such as chips that have been packaged and are to be connected to external circuits.

The metal lead frame has a larger pin pitch than that of the second reconstruction layer, and the metal lead frame is good in heat dissipation performance and reliability. More-over, a distance between the metal lead frame and a functional surface of the chip is at least greater than 50 µm.

Exemplarily, as shown in FIG. 1, in Embodiment 1, the electrical elements 1 include a first chip 11a and a second chip 11b. The first chip 11a is a power chip, and the second chip 11b is a logic or memory chip. In other embodiments, the distribution positions, numbers and the like of the chips, the passive element, and the second package structure may be adjusted according to the functional requirements of the package structure, which is not specifically limited in the present invention.

The second reconstruction layer 4 has a first surface 41 and a second surface 42 which are opposite to each other. Functional surfaces 111 of the electrical elements 1 are disposed on and electrically connected to the first surface 41 of the second reconstruction layer 4, wherein at least one of the chips 11 of the electrical elements 1 is electrically connected, through the first reconstruction layer 2 disposed on the functional surface 111 thereof, to the second reconstruction layer 4. The functional surface 111 of said chip is electrically connected, by a pad 113 disposed thereon, to the first reconstruction layer 2.

The first reconstruction layer 2 is a first redistribution layer or a first interposer. Specifically, in this embodiment, the first reconstruction layer 2 is a first redistribution layer 2a, and the second reconstruction layer 4 is a second redistribution layer 4a.

The redistribution layer includes metal wiring regions and inorganic or organic insulating dielectric regions disposed among the metal wiring regions, and is configured for rearrangement of I/O ports of the chip 11, i.e., arrange the I/O ports of the chip 11 to a new region with an occupied pitch that may be wider. The interposer includes a substrate, through-silicon vias in the substrate, and redistribution lines disposed on the substrate, etc. The interposer functions like the redistribution layer, and is configured for rearrangement of the I/O ports of the chip 11. According to the design requirements of the chip 11, the I/O ports of the chip 11 may be reconstructed for the first time through the first redistribution layer 2a or the first interposer.

The first plastic package layer 3 covers the electrical elements 1 and the first reconstruction layer 2, and includes a first surface 31 on the functional surface 111 side of the chip and a second surface 32 opposite to the first surface 31. The second surface 32 of the first plastic package layer 3 exposes the first redistribution layer 2a. In a manufacturing process, plastic packaging is first performed on the electrical elements 1 and the first reconstruction layer 2. For example, the electrical elements 1 may be placed on a temporary carrier plate for plastic packaging, and then the temporary carrier plate may be peeled off; and the second surface 32 of the formed first plastic package layer and the surface layer of the first reconstruction layer 2 are disposed on the same plane.

A material used for the plastic package layer is such as an organic polymer resin with an inorganic filler, or an organic polymer resin with a glass fabric and a filler, or an epoxy resin, polyimide (PI), a dry film and other polymer composites with fillers.

Exemplarily, in Embodiment 1, the first redistribution layer 2a is formed on the pad 113 of the functional surface 111 of each of the first chip 11a and the second chip 11b; the first plastic package layer 3 covers the first chip 11a and the second chip 11b as well as the first redistribution layer 2a; and the first surface 31 of the first plastic package layer is flush with the non-functional surfaces 112 of the first chip 11a and the second chip 11b.

The second redistribution layer 4a is disposed on the first redistribution layer 2a and the second surface 32 of the first plastic package layer, and is configured to reconstruct the I/O ports of the chip 11 for the second time on the basis of the first redistribution layer 2a. The metal lead frame 5 is low in pin density, with a pin pitch that is much larger than that of the electrical elements 1. Therefore, it is necessary to reconstruct the I/O ports of the chip 11 for the second time through the second redistribution layer 4a, such that the I/O ports of the chip 11 may be electrically interconnected with the metal lead frame 5.

Further, a metal wiring region 43 within the second redistribution layer 4a at least exceeds an outer edge of one side of each of the electrical elements 1. That is, a projection of each of the electrical elements 1 in a perpendicular direction is within an edge contour of the metal wiring region 43 of the second redistribution layer 4a. The arrangement of the second redistribution layer 4a having a larger wiring area with respect to the electrical elements 1 is more conducive to the reconstruction optimization of the I/O ports of the chip 11, as well as the thermal management plane homogenization and hotspot reduction of the package structure.

The second surface 42 of the second reconstruction layer 4 is disposed on and electrically connected to the metal lead frame 5.

Further, the second reconstruction layer 4 is disposed on the metal lead frame 5 through a metal bump 7, which is made of copper, silver, nickel, tin and other metal materials and alloys with excellent electrical conductivity, or a multilayer combination thereof. The arrangement of the second reconstruction layer 4 on the metal lead frame 5 by the metal bump 7 can improve the overcurrent capability of a circuit, enhance the heat dissipation performance, improve the reliability and the like.

Further, a distance between the metal lead frame and the functional surface of the chip is controlled to be at least greater than 50 sm.

In summary, the chip 11 having high-density I/O ports forms an electrical interconnection with the metal lead frame 5 sequentially through the first reconstruction layer 2, the second reconstruction layer 4, and the metal bump 7, such that a fan-out package structure with high-density wiring is formed on the metal lead frame 5 having the advantages such as low cost, high reliability and ease of thermal management; and the heat dissipation capacity of the functional surface of the chip is greatly improved by the metal lead frame. Thus, the package structure achieves excellent heat dissipation performance and reliability while being provided with the high-density wiring.

Exemplarily, in Embodiment 1, the second redistribution layer 4a is formed on the second surface 32 of the first plastic package layer and the first redistribution layer 2a, and is flip-mounted on the metal lead frame 5 through copper bumps. The metal wiring regions of the second redistribution layer 4a exceed outer edges of the first chip 11a and the second chips 11b, respectively.

In some embodiments of the present invention, the metal lead frame 5 is further provided with a chip-on-frame and/or a device-on-frame, which has a relatively low distribution density of I/O ports and may be directly disposed on the metal lead frame 5. By providing the chip-on-frame and/or the device-on-frame on the metal lead frame 5, the integration degree of the package structure can be further improved.

Exemplarily, in Embodiment 1, a device-on-frame 8 is disposed on the metal lead frame 5.

The second plastic package layer 6 covers the first plastic package layer 3, the second redistribution layer 4a and the metal lead frame 5, and includes a first surface disposed on the functional surface 111 side of each of the electrical elements 1 and a second surface opposite to the first surface.

Further, in some embodiments of the present invention, the first surface 31 of the first plastic package layer and the first surface 61 of the second plastic package layer expose the non-functional surface 112 of the chip, thereby improving the heat dissipation performance of the package structure.

Exemplarily, in Embodiment 1, the second plastic package layer 6 covers the first plastic package layer 3, the second redistribution layer 4a, the metal lead frame 5 and the device-on-frame 8, and the first surface 31 of the first plastic package layer and the first surface 61 of the second plastic package layer are flush with and exposed to the non-functional surface 112 of the chip.

Furthermore, in some embodiments of the present invention, the first plastic package layer 3, the second surface 62 of the second plastic package layer, and the non-functional surface 112 of the chip are further provided with a heat dissipation layer or a heat dissipation structural member to further enhance the heat dissipation capacity of the package structure. The heat dissipation layer is a film layer with excellent heat dissipation performance, such as one or more metal layers deposited by physical sputtering; and the heat dissipation structural member is a structural member such as a metal heat sink.

Figure 2:
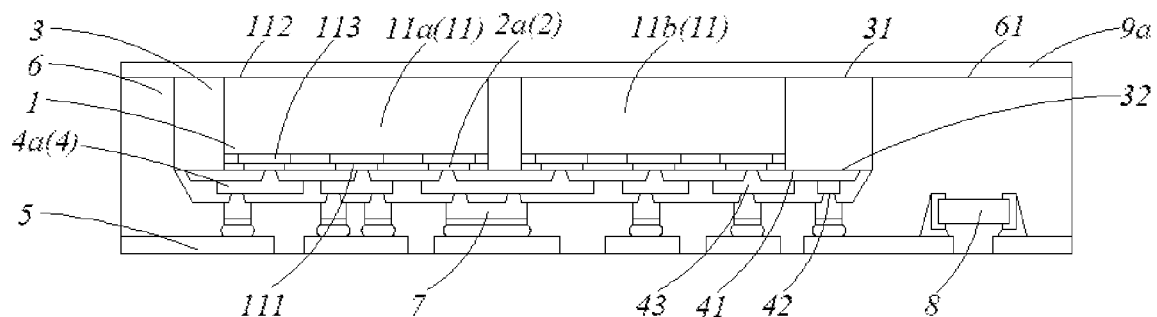
FIG. 2 is a schematic diagram of a package structure according to Embodiment 2 of the present invention.

Exemplarily, as shown in FIG. 2, Embodiment 2 is different from Embodiment 1 in that: a heat dissipation layer 9a is further disposed on an upper surface of the package structure; and the heat dissipation layer 9a completely covers the first surface 31 of the first plastic package layer, the first surface 61 of the second plastic package layer, and non-functional surfaces 112 of the chipset.

In some other embodiments of the present invention, the non-functional surface 112 of the chip is provided with a heat dissipation layer or a heat dissipation structural member; the first plastic package layer 3 covers the heat dissipation layer or the heat dissipation structural member; and the first plastic package layer 3 and the second plastic package layer 6 expose a surface region of the heat dissipation layer or of the heat dissipation structural member. Hence, the heat dissipation structure is disposed only on the non-functional surface of part of chips with a high requirement for the heat dissipation performance, which is conducive to the reduction of cost and the balance of thermal management.

Figure 3:
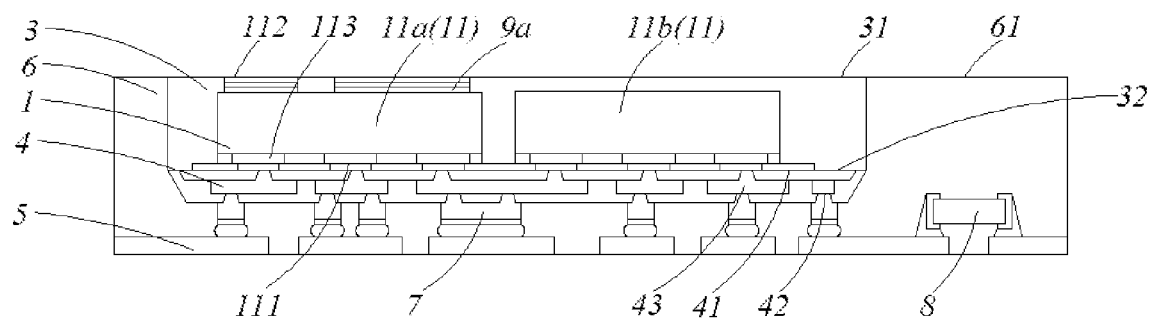
FIG. 3 is a schematic diagram of a package structure according to Embodiment 3 of the present invention.

Exemplarily, as shown in FIG. 3, Embodiment 3 is different from Embodiment 1 only in that: a plurality of stacked metal heat dissipation layers 9a are disposed only on the non-functional surface of the first chip 11a; the first chip 11a is a power chip 11, which has a higher heat dissipation requirement than that of a logic or memory chip; the first plastic package layer 3 covers the metal heat dissipation layer 9a; and the first plastic package layer 3 and the second plastic package layer 6 expose the surface region of the metal heat dissipation layer 9a.

In some other embodiments of the present invention, the first plastic package layer 3 exposes the non-functional surface 112 of the chip; the non-functional surface 112 of the chip is provided with a heat sink 9b, which is connected to the metal lead frame 5; and the second plastic package layer 6 covers the heat sink 9b and exposes an upper surface region of the heat sink 9b. The heat sink 9b is a heat dissipation structural member with a certain structural strength, such as a metal heat sink. A heat transfer channel from the metal lead frame 5 at the bottom to the heat sink 9b on an upper surface is formed within the package structure, and the metal lead frame 5 and the heat sink 9b, with excellent heat dissipation performance, are utilized to form a 3D heat dissipation structure within the package structure, which further improves the heat dissipation capacity of the package structure.

According to the requirement of thermal management, a region where the heat sink 9b covers the electrical elements 1 may be adjusted to optionally cover all the electrical elements 1, or to optionally cover part of the non-functional surface 112 of the chip with a high requirement of heat dissipation performance.

Further, a heat dissipation layer 9a or a heat dissipation structural member is disposed between the non-functional surface 112 of the chip and the heat sink 9b to cooperate with the heat sink 9b so as to further improve the heat dissipation capacity; and the arrangement of the metal heat dissipation layer 9a is conducive to the formation of a fixed relationship between the heat sink 9b and the electrical element 1. Optionally, the heat sink 9b is provided with a protruding metal bump at a bottom surface facing the metal heat dissipation layer 9a, so as to facilitate welding and fixing between the heat sink 9b and the metal layer.

The heat sink 9b is fixed to the metal lead frame 5 and the metal heat dissipation layer 9a by tin soldering or intermetallic-compound welding, or by bonding with a heat dissipation adhesive.

Figure 4:
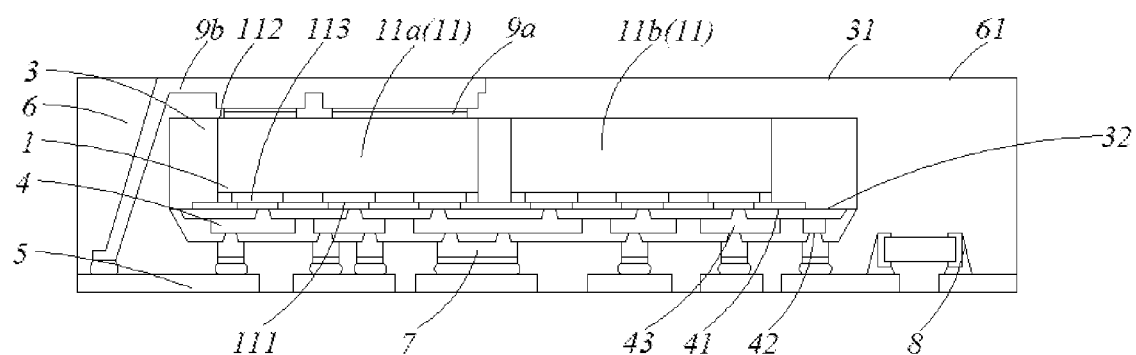
FIG. 4 is a schematic diagram of a package structure according to Embodiment 4 of the present invention.

Exemplarily, as shown in FIG. 4, Embodiment 4 is different from Embodiment 1 in that: the metal heat dissipation layer 9a is disposed only on the non-functional surface 112 of the first chip 11a; the heat sink 9b that covers metal heat dissipation layer 9a is disposed on the metal heat dissipation layer 9a; the heat sink 9b is a copper heat sink 9b having a surface provided with a plating; and the heat sink 9b extends downwards from an outer side of each of the electrical elements 1 to the metal lead frame 5, and is connected to the metal lead frame 5 by welding.

Figure 5:
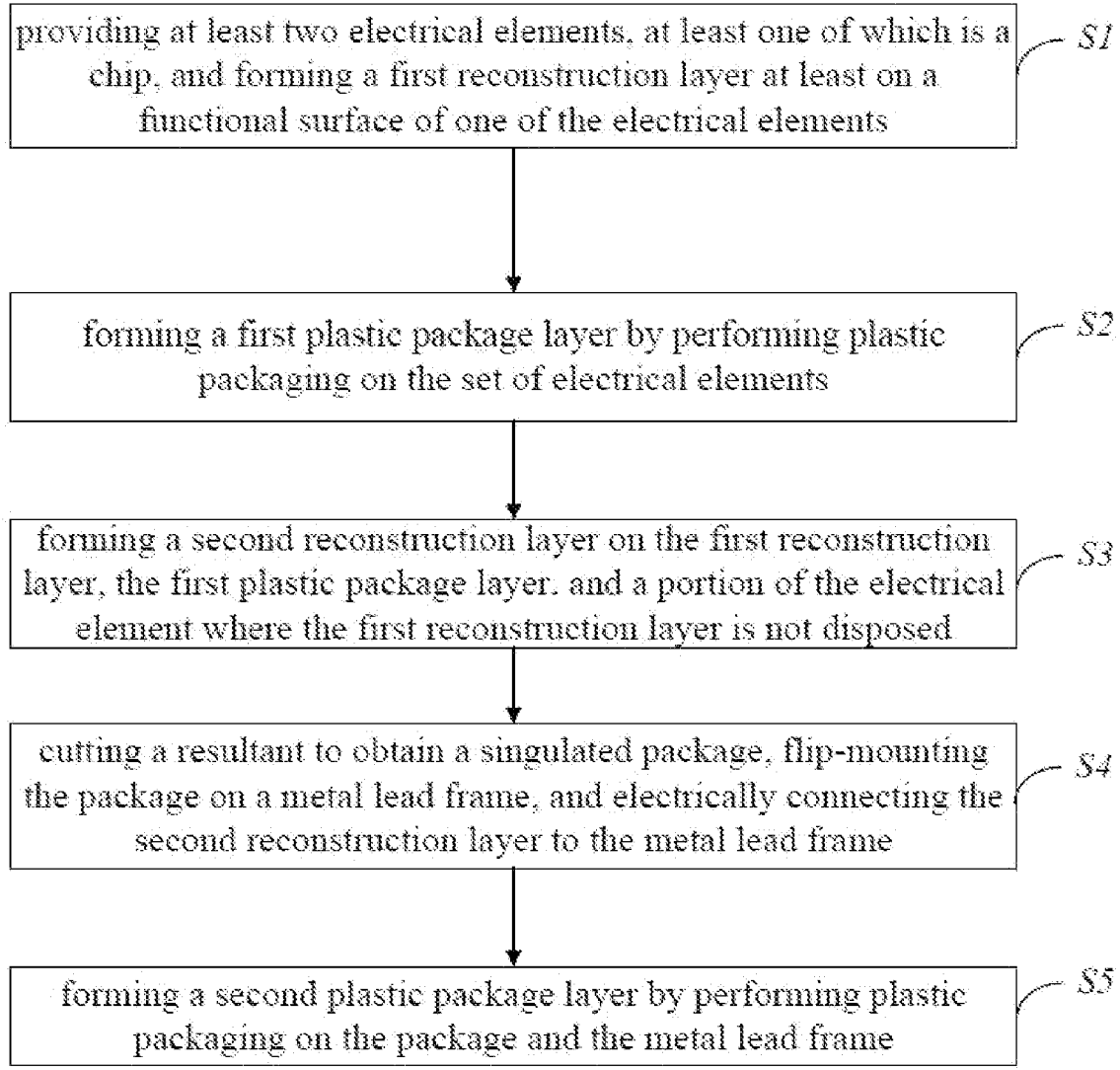
FIG. 5 is a schematic flowchart of a method for manufacturing a package structure according to Embodiment 5 of the present invention.

As shown in FIG. 5, the present invention further provides a method for manufacturing a package structure. In Embodiment 5, the method includes the following steps.

Figure 6:
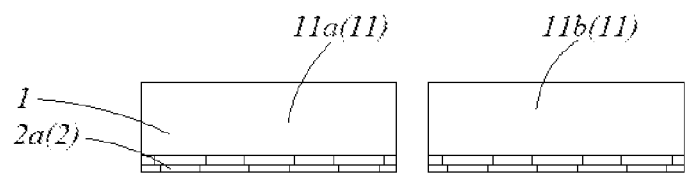
FIG. 6 to FIG. 10 are schematic diagrams of respective steps of the method for manufacturing the package structure according to Embodiment 5 of the present invention.

In S1, as shown in FIG. 6, electrical elements 1 are provided, with at least one of the electrical elements 1 being a chip 11; and a first reconstruction layer is formed at least on a non-functional surface of the chip 11.

The first reconstruction layer is a first redistribution layer or a first interposer.

Specifically, in Embodiment 5, the electrical elements 1 include a first chip 11a and a second chip 11b; and a first redistribution layer 2a is formed on a functional surface of each of the first chip 11a and the second chip 11b.

Figure 7:
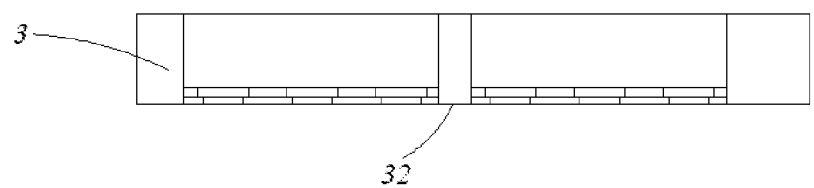

In S2, as shown in FIG. 7, a first plastic package layer 3 is formed by performing plastic packaging on the electrical elements 1.

Exemplarily, a temporary carrier plate or carrier tape may be provided, and the first chip 11a and the second chip 11b are mounted on the temporary carrier plate or carrier tape, which is peeled off after plastic packaging. The temporary carrier plate or carrier tape has a flat upper surface, such that lower end faces of the first chips 11a and the second chip 11b mounted thereon are flush with each other, that is, the second surface 32 of the formed first plastic package layer is disposed on the same plane with the first redistribution layer 2a.

Figure 8:
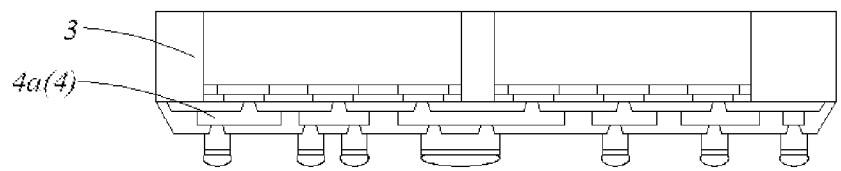

In S3, as shown in FIG. 8, a second reconstruction layer 4 is formed on the first reconstruction layer 2, the first plastic package layer 3, and portions of the electrical elements where the first reconstruction layer is not disposed.

Specifically, the second reconstruction layer 4 is a second redistribution layer 4a.

Further, metal wiring within the second redistribution layer 4a at least exceeds an outer edge of one side of each of the electrical elements 1.

Further, S3 further includes: arranging a metal bump 7 on the second reconstruction layer 4.

Figure 9:
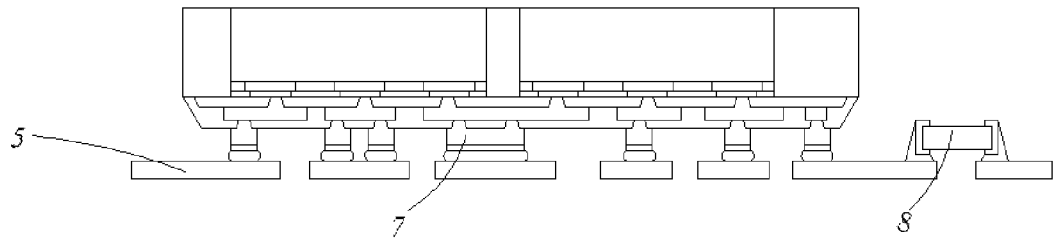

In S4, as shown in FIG. 9, a singulated package is obtained by cutting, the package is flip-mounted on a metal lead frame 5, and the second reconstruction layer 4 is electrically connected to the metal lead frame 5.

The package described here is an intermediate package structure to be subject to subsequent packaging steps after the second reconstruction layer 4 is formed.

Optionally, the metal lead frame may be a carrier plate with a support, or may be formed on a supported carrier plate which is removed or etched away after the second plastic package layer is formed.

Specifically, after the second reconstruction layer 4 is formed, the method further includes the following step: arranging the singulated package on the metal lead frame 5 through the metal bump 7 by welding.

Figure 10:
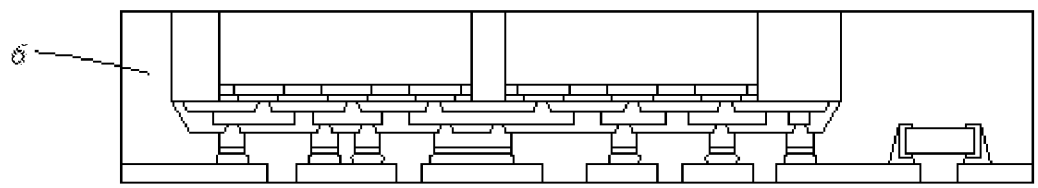

In Step S5 of FIG. 5, as shown in FIG. 10, a second plastic package layer 6 is formed by performing plastic packaging on the package and the metal lead frame 5.

Further, a non-functional surface 112 of the chip is exposed by thinning the first plastic package layer 3 and the second plastic package layer 6.

Further, in some embodiments of the present invention, the method further includes the step of arranging a chip-on-frame and/or a device-on-frame 8 on the metal lead frame 5.

In some other embodiments of the present invention, the method further includes the step of arranging different heat dissipation structures on the non-functional surface 112 of the chip. Several embodiments will be explained in detail below.

Embodiment 6 is different from Embodiment 5 in the followings.

S2 further includes the step of exposing the non-functional surface 112 of the chip by thinning the first plastic package layer 3.

Step S5 of FIG. 5 further includes the step of exposing the non-functional surface 112 of the chip by thinning the second plastic package layer 6, and forming a heat dissipation layer 9a on the non-functional surface 112 of the chip.

Embodiment 7 is different from Embodiment 5 in the followings.

Figure 11:
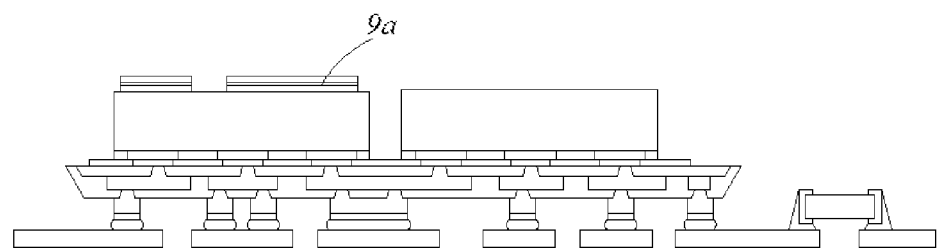
FIG. 11 to FIG. 13 are schematic diagrams of distinctive steps of a method for manufacturing a package structure according to Embodiment 7 of the present invention from that according to Embodiment 5.

As shown in FIG. 11, S1 further includes the step of forming a heat dissipation layer 9a or arranging a heat dissipation structural member on the non-functional surface 112 of the chip.

Figure 12:
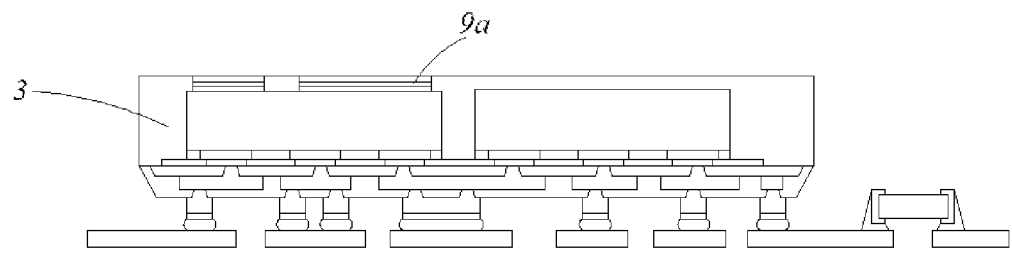

As shown in FIG. 12, S2 further includes: exposing a surface region of the heat dissipation layer 9a or of the heat dissipation structural member by thinning the first plastic package layer 3.

Figure 13:
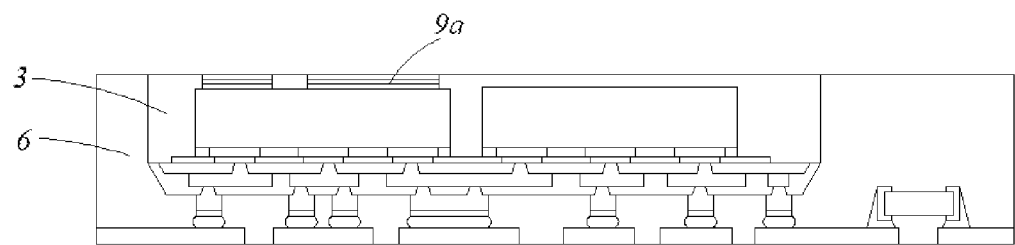

As shown in FIG. 13, Step S5 of FIG. 5 further includes: exposing the surface region of the heat dissipation layer 9a or of the heat dissipation structural member by thinning the second plastic package layer 6.

Embodiment 8 is different from Embodiment 5 in the followings.

S2 further includes: exposing the non-functional surface 112 of the chip by thinning the first plastic package layer 3.

Figure 14:
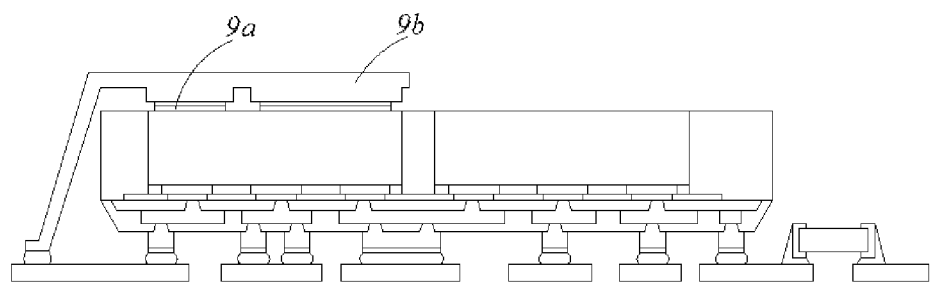
FIG. 14 and FIG. 15 are schematic diagrams of distinctive steps of a method for manufacturing a package structure according to Embodiment 8 of the present invention from that according to Embodiment 5.

As shown in FIG. 14, S4 further includes: arranging a heat sink 9b on the non-functional surface 112 of the chip, and connecting the heat sink 9b to the metal lead frame 5.

Further, before the heat sink 9b is arranged, a metal heat dissipation layer 9a or a heat dissipation structural member may be formed on the non-functional surface 112 of the chip; and the heat sink 9b may be fixed to the metal lead frame 5 and the metal heat dissipation layer 9a by tin soldering or intermetallic-compound welding, or by bonding with a heat dissipation adhesive.

Figure 15:
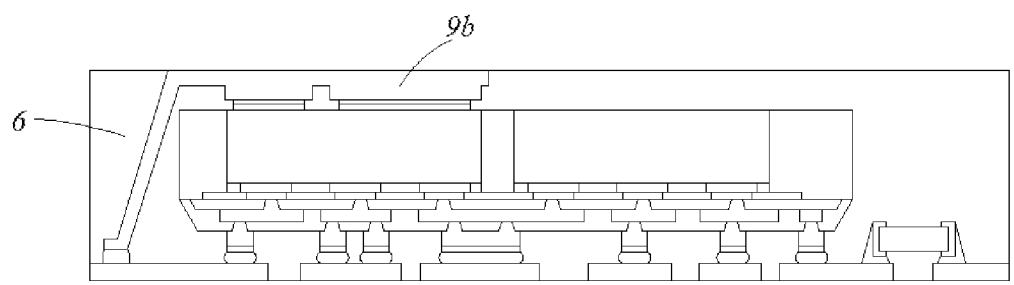

As shown in FIG. 15, Step S5 of FIG. 5 further includes: exposing an upper surface region of the heat sink 9b by thinning the second plastic package layer 6.

In summary, according to the present invention, by forming an electrical interconnection between the chipset having high-density I/O ports and the metal lead frame sequentially through the first redistribution layer or the first interposer, and the second redistribution layer, a fan-out package structure with high-density wiring is formed on the metal lead frame having the advantages such as low cost, high reliability and ease of thermal management; and the heat dissipation capacity of the functional surface of the chip is greatly improved by the metal lead frame. Thus, the package structure achieves excellent heat dissipation performance and reliability while being provided with the high-density wiring.

It should be understood that although the present invention is described in terms of embodiments in this description, not every embodiment includes only one independent technical solution. The statement mode of the description is merely for clarity, and those skilled in the art should regard the description as a whole. The technical solutions in various embodiments may also be combined properly to develop other embodiments that can be understood by those skilled in the art.

The series of detailed illustration listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. A package structure, comprising:
   at least two electrical elements, a second reconstruction layer, and a metal lead frame, wherein at least one of the electrical elements is a chip, at least one of the electrical elements is provided with a first reconstruction layer on its functional surface, and the second reconstruction layer has a smaller pin pitch than that of the metal lead frame;
   the second reconstruction layer has a first surface and a second surface which are opposite to each other, the functional surface of the electrical element is disposed on and electrically connected to the first surface of the second reconstruction layer, and the at least one of the electrical elements is electrically connected to the second reconstruction layer through the first reconstruction layer disposed on the functional surface thereof, and
   the second surface of the second reconstruction layer is disposed on and electrically connected to the metal lead frame.

2. The package structure according to claim 1, wherein the first reconstruction layer is a first redistribution layer or a first interposer, and the second reconstruction layer is a second redistribution layer.

3. The package structure according to claim 2, wherein a metal wiring region within the second redistribution layer at least exceeds an outer edge of one side of each of the electrical elements.

4. The package structure according to claim 3, wherein the second redistribution layer is disposed on the metal lead frame through a metal bump, and a distance between the metal lead frame and the functional surface of the chip is at least greater than 50 μm.

5. The package structure according to claim 1, further comprising: a first plastic package layer and a second plastic package layer, wherein the first plastic package layer covers the electrical elements and the first reconstruction layer; the second plastic package layer covers the first plastic package layer, the second reconstruction layer, and the metal lead frame; and the first plastic package layer and the second plastic package layer each comprise a first surface on a non-functional surface side of the electrical element and a second surface opposite to the first surface.

6. The package structure according to claim 5, wherein the second surface of the first plastic package layer exposes the first reconstruction layer, and the second reconstruction layer is disposed on the first redistribution layer and the second surface of the first plastic package layer.

7. The package structure according to claim 5, wherein the first surface of the first plastic package layer and the first surface of the second plastic package layer expose the non-functional surface of the chip.

8. The package structure according to claim 7, wherein a heat dissipation layer or a heat dissipation structural member is disposed on the first plastic package layer, the first surface of the second plastic package layer, and the non-functional surface of the chip.

9. The package structure according to claim 5, wherein a heat dissipation layer or a heat dissipation structural member is disposed on the non-functional surface of the chip; the first plastic package layer covers the heat dissipation layer or the heat dissipation structural member; and the first plastic package layer and the second plastic package layer expose a surface region of the heat dissipation layer or of the heat dissipation structural member.

10. The package structure according to claim 5, wherein the first plastic package layer exposes the non-functional surface of the chip; a heat sink is disposed on the non-functional surface of the chip and is connected to the metal lead frame; and the second plastic package layer covers the heat sink and exposes a surface region of the heat sink.

11. The package structure according to claim 10, wherein a heat dissipation layer or a heat dissipation structural member is disposed between the non-functional surface of the chip and the heat sink.

12. The package structure according to claim 11, wherein the metal lead frame is provided with a chip-on-frame and/or a device-on-frame.

13. A method for manufacturing a package structure, comprising the following steps:
providing at least two electrical elements, at least one of which is a chip, and forming a first reconstruction layer at least on a functional surface of one of the electrical elements;
forming a first plastic package layer by performing plastic packaging on the set of electrical elements;
forming a second reconstruction layer on the first reconstruction layer, the first plastic package layer, and a portion of the electrical element where the first reconstruction layer is not disposed;
cutting a resultant to obtain a singulated package, flip-mounting the package on a metal lead frame, and electrically connecting the second reconstruction layer to the metal lead frame; and
forming a second plastic package layer by performing plastic packaging on the package and the metal lead frame.

14. The method for manufacturing the package structure according to claim 13, wherein the first reconstruction layer is a first redistribution layer or a first interposer, and the second reconstruction layer is a second redistribution layer.

15. The method for manufacturing the package structure according to claim 14, wherein metal wiring within the second redistribution layer at least exceeds an outer edge of one side of each of the electrical elements.

16. The method for manufacturing the package structure according to claim 13, further comprising the following step:
arranging a metal bump on the second reconstruction layer, flip-mounting the second reconstruction layer on the metal lead frame through the metal bump, and controlling a distance between the metal lead frame and the functional surface of the chip to be at least greater than 50 μm.

17. The method for manufacturing the package structure according to claim 13, further comprising the following steps:
exposing a non-functional surface of the chip by thinning the first plastic package layer and the second plastic package layer, and forming a heat dissipation layer or arranging a heat dissipation structural member on the non-functional surface of the chip.

18. The method for manufacturing the package structure according to claim 13, further comprising the following steps:
forming a heat dissipation layer or arranging a heat dissipation structural member on a non-functional surface of the chip before forming the first plastic package layer; and
exposing a surface region of the heat dissipation layer or of the heat dissipation structural member by thinning the first plastic package layer and the second plastic package layer.

19. The method for manufacturing the package structure according to claim 13, further comprising the following steps:
exposing a non-functional surface of the chip by thinning the first plastic package layer;
arranging a heat sink on the non-functional surface of the chip before forming the second plastic package layer, and connecting the heat sink to the metal lead frame; and
exposing a surface region of the heat sink by thinning the second plastic package layer.

20. The method for manufacturing the package structure according to claim 13, further comprising the following step:
arranging a chip-on-frame and/or a device-on-frame on the metal lead frame.

* * * * *